United States Patent
Ando et al.

(10) Patent No.: US 10,332,809 B1
(45) Date of Patent: Jun. 25, 2019

(54) METHOD AND STRUCTURE TO INTRODUCE STRAIN IN STACK NANOSHEET FIELD EFFECT TRANSISTOR

(71) Applicant: International Business Machines Corporation, Armonk, NY (US)

(72) Inventors: Takashi Ando, Tuckahoe, NY (US); Jingyun Zhang, Albany, NY (US); Choonghyun Lee, Rensselaer, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/014,911

(22) Filed: Jun. 21, 2018

(51) Int. Cl.
| | |
|---|---|
| *H01L 21/84* | (2006.01) |
| *H01L 27/12* | (2006.01) |
| *H01L 29/49* | (2006.01) |
| *H01L 21/285* | (2006.01) |
| *H01L 29/423* | (2006.01) |

(Continued)

(52) U.S. Cl.
CPC ........ *H01L 21/845* (2013.01); *H01L 27/1211* (2013.01); *H01L 21/28518* (2013.01); *H01L 29/0673* (2013.01); *H01L 29/42392* (2013.01); *H01L 29/4908* (2013.01); *H01L 29/7845* (2013.01); *H01L 29/7853* (2013.01)

(58) Field of Classification Search
CPC ............... H01L 21/845; H01L 27/1211; H01L 29/7845; H01L 29/7853; H01L 29/0673; H01L 21/28518; H01L 29/4908; H01L 29/42392

See application file for complete search history.

(56) References Cited

U.S. PATENT DOCUMENTS 5,965,914 A * 10/1999 Miyamoto ........ H01L 29/42392
257/331
8,564,025 B2 * 10/2013 Bangsaruntip ......... B82Y 10/00
257/12

(Continued)

OTHER PUBLICATIONS

Loubet, N., et al., "Stacked Nanosheet Gate-All-Around Transistor to Enable Scaling Beyond FinFET", 2017 Symposium on VLSI Technology Digest of Technical Papers, Date of Conference: Jun. 5-8, 2017, 2 pages, Conference Location: Kyoto, Japan.

(Continued)

*Primary Examiner* — Earl N Taylor
(74) *Attorney, Agent, or Firm* — Scully, Scott, Murphy & Presser, P.C.; L. Jeffrey Kelly, Esq.

(57) ABSTRACT

A semiconductor structure is provided that includes a pFET gate-all-around nanosheet structure and an nFET gate-all-around nanosheet structure integrated together on the same substrate. The pFET gate-all-around nanosheet structure contains a nickel monosilicide gate electrode layer that does not introduce strain into each suspended semiconductor channel material nanosheet of a first vertical stack of suspended semiconductor channel material nanosheets. The nFET gate-all-around nanosheet structure contains a $Ni_3Si$ gate electrode layer that introduces strain into each suspended semiconductor channel material nanosheet of a second vertical stack of suspended semiconductor channel material nanosheets.

20 Claims, 3 Drawing Sheets

(51) Int. Cl.
*H01L 29/06* (2006.01)
*H01L 29/78* (2006.01)

(56) References Cited

U.S. PATENT DOCUMENTS

| | | | | |
|---|---|---|---|---|
| 8,765,563 | B2* | 7/2014 | Pillarisetty | H01L 29/7853 438/312 |
| 9,224,810 | B2* | 12/2015 | Kim | H01L 27/092 |
| 9,570,609 | B2* | 2/2017 | Obradovic | H01L 29/7845 |
| 9,634,091 | B2* | 4/2017 | Ching | H01L 21/82382 |
| 9,634,140 | B2* | 4/2017 | Kittl | H01L 29/7845 |
| 9,653,480 | B1* | 5/2017 | Cheng | H01L 27/1211 |
| 9,653,537 | B1* | 5/2017 | Jagannathan | H01L 29/0665 |
| 9,842,835 | B1* | 12/2017 | Cheng | H01L 27/0629 |
| 9,871,140 | B1* | 1/2018 | Balakrishnan | H01L 29/7848 |
| 9,929,266 | B2* | 3/2018 | Balakrishnan | H01L 29/778 |
| 9,935,014 | B1* | 4/2018 | Cheng | H01L 21/823462 |
| 9,935,016 | B2* | 4/2018 | Ching | H01L 21/82382 |
| 10,163,729 | B2* | 12/2018 | Ching | H01L 21/82382 |
| 2005/0023619 | A1* | 2/2005 | Orlowski | H01L 29/42384 257/401 |
| 2007/0029586 | A1* | 2/2007 | Orlowski | B82Y 10/00 257/287 |
| 2008/0017934 | A1* | 1/2008 | Kim | H01L 29/0657 257/401 |
| 2008/0211000 | A1* | 9/2008 | Matsuki | H01L 21/28097 257/296 |
| 2008/0272439 | A1* | 11/2008 | Kapoor | H01L 21/2257 257/369 |
| 2013/0161756 | A1* | 6/2013 | Glass | H01L 29/66545 257/369 |
| 2013/0270512 | A1* | 10/2013 | Radosavljevic | H01L 21/82382 257/9 |
| 2014/0001520 | A1* | 1/2014 | Glass | H01L 29/66439 257/288 |
| 2014/0042386 | A1* | 2/2014 | Cea | H01L 29/42392 257/9 |
| 2014/0091279 | A1* | 4/2014 | Kachian | B82Y 10/00 257/27 |
| 2014/0091360 | A1* | 4/2014 | Pillarisetty | H01L 29/7853 257/190 |
| 2014/0131660 | A1* | 5/2014 | Cea | H01L 29/42392 257/24 |
| 2014/0197377 | A1* | 7/2014 | Kim | H01L 27/092 257/29 |
| 2014/0209855 | A1* | 7/2014 | Cea | H01L 29/41791 257/9 |
| 2014/0291726 | A1* | 10/2014 | Pillarisetty | H01L 29/7853 257/190 |
| 2015/0053928 | A1* | 2/2015 | Ching | H01L 21/82382 257/29 |
| 2017/0069481 | A1* | 3/2017 | Doris | H01L 21/0228 |
| 2018/0068857 | A1* | 3/2018 | Adusumilli | H01L 21/28518 |
| 2018/0068903 | A1* | 3/2018 | Adusumilli | H01L 29/161 |
| 2018/0097059 | A1* | 4/2018 | Bi | H01L 29/0649 |
| 2018/0122899 | A1* | 5/2018 | Guillorn | H01L 29/0665 |
| 2018/0190809 | A1* | 7/2018 | Huang | H01L 23/485 |
| 2018/0253568 | A1* | 9/2018 | Cheng | G06F 21/73 |
| 2018/0277656 | A1* | 9/2018 | Chao | H01L 29/66553 |
| 2018/0308988 | A1* | 10/2018 | Chao | H01L 21/2255 |

OTHER PUBLICATIONS

Takahashi, K. et al., "Dual Workfunction Ni-Silicide/HfSiON Gate Stacks by Phase-Controlled Full-Silicidation (PC-FUSI)'TechniqUe for 45nm-node LSTP and LOP Devices", IEDM Technical Digest. IEEE International Electron Devices Meeting 2004, Date of Conference: Dec. 13-15, 2004, 4 pages, Conference Location: San Francisco, CA, USA.

Saitoh, M., et al., "Strain Controlled CMOSFET with Phase Controlled Full-silicide (PC-FUSI)/HfSiON Gate Stack Structure for 45nm-node LSTP Devices", 2006 Symposium on VLSI Technology Digest of Technical Papers, Date of Conference: Jun. 13-15, 2006, 2 pages.

* cited by examiner

METHOD AND STRUCTURE TO INTRODUCE STRAIN IN STACK NANOSHEET FIELD EFFECT TRANSISTOR

BACKGROUND

The present application relates to a stacked nanosheet semiconductor structure and a method of forming the same. More particularly, the present application relates to a gate-all-around structure in which strain has been introduced into a vertical stack of semiconductor channel material nanosheets after the semiconductor channel material nanosheets have been suspended.

Gate-all-around nanosheet structures containing a plurality of vertically stacked and suspended semiconductor channel material nanosheets are a good candidate for the replacement of FinFET structures at the 5 nm technology node and beyond. Such gate-all-around nanosheet structures offer increased effective width ($W_{eff}$) per active footprint and better performance compared to finFETs. In gate-all-around nanosheet structures containing a plurality of vertically stacked and suspended semiconductor channel material nanosheets, the stacked nanosheet formation relies on the selective removal of one semiconductor material (i.e., the sacrificial semiconductor material nanosheet) relative to another semiconductor material (i.e., the semiconductor channel material nanosheet) to form vertically stacked and suspended semiconductor channel material nanosheets for gate-all-around devices.

It is known that channel strain is relaxed after removing the sacrificial semiconductor material nanosheets and thus suspending the semiconductor channel material nanosheets. It is difficult to apply external strain afterwards, and there is no known process that aims to enhance the performance of the nanosheet transistor via channel stain. Thus, there is a need for providing a method to apply stain after the formation of suspended semiconductor channel material nanosheets.

SUMMARY

A semiconductor structure is provided that includes a pFET gate-all-around nanosheet structure and an nFET gate-all-around nanosheet structure integrated together on the same substrate. The pFET gate-all-around nanosheet structure contains a nickel monosilicide gate electrode layer that does not introduce strain into each suspended semiconductor channel material nanosheet of a first vertical stack of suspended semiconductor channel material nanosheets. The nFET gate-all-around nanosheet structure contains a $Ni_3Si$ gate electrode layer that introduces strain into each suspended semiconductor channel material nanosheet of a second vertical stack of suspended semiconductor channel material nanosheets.

In one aspect of the present application, a semiconductor structure is provided. In one embodiment, the semiconductor structure includes a pFET gate-all-around nanosheet structure and an adjacent nFET gate-all-around nanosheet structure. The pFET gate-all-around nanosheet structure includes a first vertical stack of suspended semiconductor channel material nanosheets, a first gate dielectric material layer wrapped around each suspended semiconductor channel material nanosheet of the first vertical stack, a first titanium nitride layer laterally surrounding each suspended semiconductor channel material nanosheet of the first vertical stack, wherein a portion of the first titanium nitride layer is located completely between and beneath each suspended semiconductor channel material nanosheet of the first vertical stack, and a nickel monosilicide gate electrode layer located on the first titanium nitride layer.

The nFET gate-all-around nanosheet structure includes a second vertical stack of suspended semiconductor channel material nanosheets, a second gate dielectric material layer wrapped around each suspended semiconductor channel material nanosheet of the second vertical stack, a second titanium nitride layer laterally surrounding each suspended semiconductor channel material nanosheet of the second vertical stack, wherein a portion of the second titanium nitride layer is located partially between and beneath each suspended semiconductor channel material nanosheet of the second vertical stack, and a $Ni_3Si$ gate electrode layer located on the second titanium nitride layer, wherein a portion of the $Ni_3Si$ gate electrode layer is located between and beneath each suspended semiconductor channel material nanosheet of the second vertical stack.

In accordance with the present application, the $Ni_3Si$ gate electrode layer introduces a strain into the each suspended semiconductor channel material nanosheet of the second vertical stack, while the nickel monosilicide gate electrode layer does not introduce strain into each suspended semiconductor channel material nanosheet of the first vertical stack. In some embodiments, only an nFET gate-all-around nanosheet structure, as defined above, is formed above a semiconductor substrate.

In another aspect of the present application, a method of forming a semiconductor structure is provided. In one embodiment the method includes providing a plurality of suspended semiconductor channel material nanosheets located in a pFET device region, and a plurality of suspended semiconductor channel material nanosheets located in an nFET device region; forming, in any order, a first gate dielectric material layer around each suspended semiconductor channel material nanosheet in the pFET device region and a second gate dielectric material layer around each suspended semiconductor channel material nanosheet in the nFET device region; forming, in any order, a first titanium nitride layer laterally surrounding each suspended semiconductor channel material nanosheet in the pFET device region, wherein a portion of the first titanium nitride layer is located completely between and beneath each suspended semiconductor channel material nanosheet in the pFET device region, and a second titanium nitride layer laterally surrounding each suspended semiconductor channel material nanosheet in the nFET device region, wherein a portion of the second titanium nitride layer is located partially between and beneath each suspended semiconductor channel material nanosheet in the nFET device region; forming a first amorphous silicon layer on the first titanium layer, and a second amorphous silicon layer on the second titanium, wherein the second amorphous layer is located between and beneath each suspended semiconductor channel material nanosheet in the nFET device region; forming, in any order, a first nickel layer having a first thickness on the first amorphous silicon layer, and a second nickel layer having a second thickness that is greater than the first thickness on the second amorphous silicon layer; and performing an anneal to convert the first nickel layer and the first amorphous silicon layer in the pFET device region into nickel monosilicide gate electrode layer, and to convert the second nickel layer and the second amorphous silicon layer in the nFET device region into a $Ni_3Si$ gate electrode layer.

DETAILED DESCRIPTION

Figure 1:
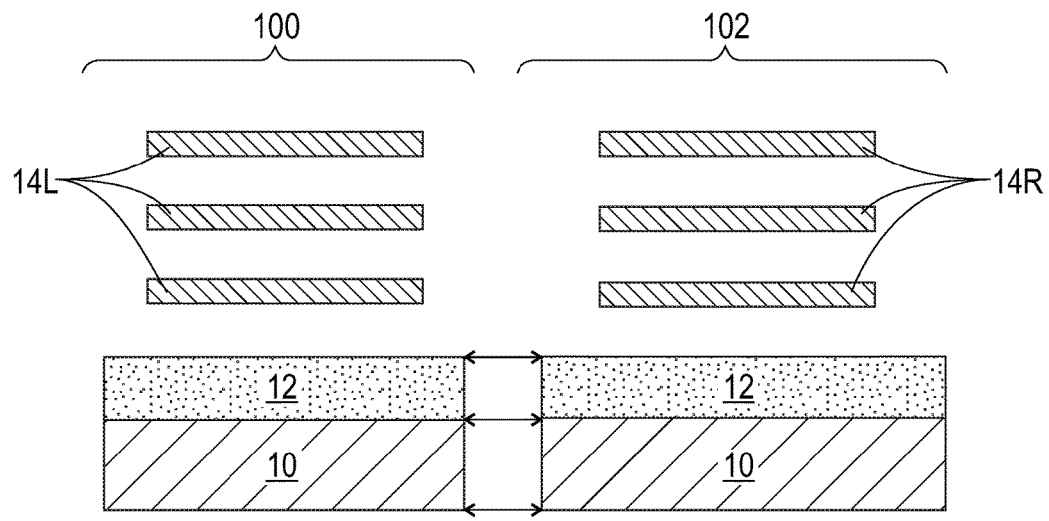
FIG. 1 is a cross sectional view of an exemplary semiconductor structure of the present application during an early stage of fabrication and including a plurality of suspended semiconductor channel material nanosheets located in a pFET device region, and a plurality of suspended semiconductor channel material nanosheets located in an nFET device region.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure of the present application during an early stage of fabrication and including a plurality of suspended semiconductor channel material nanosheets (i.e., a first vertical stack of suspended semiconductor channel material nanosheets) 14L located in a pFET device region 100, and a plurality of suspended semiconductor channel material nanosheets (i.e., a second vertical stack of suspended semiconductor channel material nanosheets) 14R located in an nFET device region 102. It is noted that the drawings of the present application are cross sectional views illustrating the channel region only within each device region. While the present application describes and illustrates the presence of a pFET device region 100 and an nFET device region 102, the present application can be apply when only an nFET device region 102 is present.

In this embodiment, the pFET device region 100 is laterally adjacent to the nFET device region 102 for illustration purposes, however, other configurations are also possible. The plurality of suspended semiconductor channel material nanosheets 14L in the pFET device region 100 and the plurality of suspended semiconductor channel material nanosheets 14R in the nFET device region 102 are located above a semiconductor substrate 10. A dielectric isolation layer 12 is located on a topmost surface of the semiconductor substrate 10 in both the pFET device region 100 and the nFET device region 102.

The semiconductor substrate 10 that can be employed in the present application includes at least one semiconductor material that has semiconducting properties. Examples of semiconductor materials that can be used as the semiconductor substrate 10 include, for example, silicon (Si), a silicon germanium (SiGe) alloy, a silicon germanium carbide (SiGeC) alloy, germanium (Ge), III/V compound semiconductors or II/VI compound semiconductors. In one embodiment, the semiconductor substrate 10 may be a bulk semiconductor substrate. The term "bulk semiconductor substrate" denotes a substrate that is composed entirely of one or more semiconductor materials. In one example, the bulk semiconductor substrate is composed entirely of Si.

The dielectric isolation layer 12 may be composed of dielectric material such as, for example, silicon dioxide, silicon nitride and/or silicon oxynitride. The dielectric isolation layer 12 may have a thickness from 10 nm to 50 nm. Other thicknesses for the dielectric isolation layer 12 are conceivable and can be used in the present application.

In one embodiment, the dielectric isolation layer 12 may be an insulator layer of a semiconductor-on-insulator substrate (SOI). In such an embodiment, the semiconductor substrate 10 represents a handle substrate of the SOI substrate, and the topmost semiconductor material layer of the SOI substrate represents a bottommost sacrificial semiconductor material layer of a semiconductor material stack of alternating layers of a sacrificial semiconductor material and a semiconductor channel material which is used in providing the suspended semiconductor channel material nanosheets 14L, 14R.

In yet another embodiment, the dielectric isolation layer 12 is a deposited dielectric material that is formed on the semiconductor substrate 10 prior to the formation of a semiconductor material stack that is used in providing the suspended semiconductor channel material nanosheets 14L, 14R. In some embodiments, it may be possible to form the dielectric isolation layer 12 after suspending the semiconductor channel material nanosheets 14L, 14R.

Each suspended semiconductor channel material nanosheet 14L, 14R comprises one of the semiconductor materials mentioned above for the semiconductor substrate 10. In one embodiment of the present application, each suspended semiconductor channel material nanosheet 14L, 14R is composed of silicon. In some embodiments, each suspended semiconductor channel material nanosheet 14L, 14R is composed of silicon having a (100) crystal orientation.

Each suspended semiconductor channel material nanosheet 14L, 14R may have a thickness from 5 nm to 20 nm, and a width from 30 nm to 200 nm. Each suspended semiconductor channel material nanosheet 14L, 14R within a given vertical stack of suspended semiconductor channel material nanosheets has outermost sidewalls that are vertically aligned to each other. Each suspended semiconductor channel material nanosheet within a given vertical stack of suspended semiconductor channel material nanosheets is separated by a gap that has a height of from 8 nm to 20 nm. The bottommost suspended semiconductor channel material nanosheet within a given vertical stack of suspended semiconductor channel material nanosheets is separated from a topmost surface of the dielectric isolation layer 12 by a gap that has height of from 8 nm to 20 nm.

The plurality of suspended semiconductor channel material nanosheets 14L, 14R can be formed utilizing techniques that are well known to those skilled in the art. In one example, the plurality of suspended semiconductor channel material nanosheets 14L, 14R can be formed by first providing a semiconductor material stack of alternating layers of sacrificial semiconductor material layers and semiconductor channel material layers in both device regions. The sacrificial semiconductor material layers are composed of a semiconductor material that has a different etch rate than the semiconductor material that provides each semiconductor channel material layer. In one example, and when silicon is employed for each semiconductor channel material layer, a silicon germanium alloy may be employed for each sacrificial semiconductor material layer.

The alternating layers of sacrificial semiconductor material layers and semiconductor channel material layers may be formed utilizing an epitaxial growth process. In some embodiments, the bottommost sacrificial semiconductor material layer is the topmost semiconductor layer of an SOI substrate as described above. Next, the semiconductor material stack of alternating layers of sacrificial semiconductor material layers and semiconductor channel material layers is patterned to provide a patterned semiconductor material stack in each device region. The patterned semiconductor material stack is composed of alternating layers of remaining portions of the sacrificial semiconductor material layers and remaining portions of semiconductor channel material layers. A sacrificial gate structure (not shown) is then formed around a portion of each patterned semiconductor material stack. A gate spacer composed of a gate spacer material such as, for example, silicon nitride may be formed laterally surrounding the sacrificial gate structure and over another portion of the patterned semiconductor material stack. Next, an etch is used to remove remaining portions of the sacrificial semiconductor material layers and the remaining portions of semiconductor channel material layers of the patterned semiconductor material stack that are not protected by the sacrificial gate structure and the gate spacer. This etch provides a vertical stack of alternating nanosheets of sacrificial semiconductor material nanosheets and semiconductor channel material nanosheets.

A lateral etch can then be performed to recess end portions of sacrificial semiconductor material nanosheet and thereafter an inner dielectric spacer is formed on exposed sidewalls of each recessed sacrificial semiconductor material nanosheet. Next, source/drain (S/D) regions can be formed by epitaxial growth of a semiconductor material on physically exposed sidewalls of each semiconductor channel material nanosheet. An interlevel dielectric (ILD) material such as, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof, is then formed and thereafter each sacrificial gate structure is removed by etching, followed by the removal (by etching) of each recessed sacrificial semiconductor material nanosheet to provide the suspended semiconductor channel material nanosheets 14L, 14R shown in FIG. 1. The term "low-k" as used throughout the present application denotes a dielectric material that has a dielectric constant of less than silicon dioxide.

Figure 2:
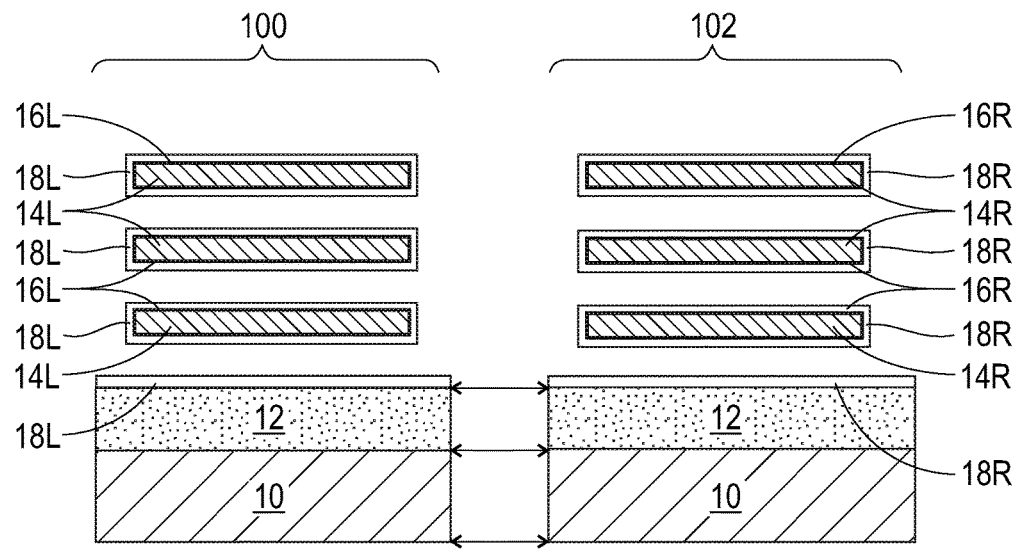
FIG. 2 is a cross sectional view of the exemplary semiconductor structure of FIG. 1 after forming a first gate dielectric material stack located around each suspended semiconductor channel material nanosheet in the pFET device region and a second gate dielectric material stack located around each suspended semiconductor channel material nanosheet in the nFET device region.

Referring now FIG. 2, there is illustrated the exemplary semiconductor structure of FIG. 1 after forming, in any order, a first gate dielectric material stack (16L, 18L) located around each suspended semiconductor channel material nanosheet 14L in the pFET device region 100 and a second gate dielectric material stack (16R, 18R) located around each suspended semiconductor channel material nanosheet 14R in the nFET device region 102. As is shown and during this step of the present application, a first gate dielectric material layer 18L is also formed on a topmost surface of the dielectric isolation layer 12 in the pFET device region 100, while a second gate dielectric material layer 18R is also formed on a topmost surface of the dielectric isolation layer 12 in the nFET device region 102.

In one embodiment of the present application, the first gate dielectric material stack (16L, 18L) includes a first interfacial gate dielectric material layer 16L and a first gate dielectric material layer 18L. In another embodiment, the first interfacial gate dielectric material layer 16L may be omitted. In such an embodiment, the first gate dielectric material stack consists of the first gate dielectric material layer 18L. When present, the first interfacial gate dielectric material layer 16L may include silicon oxide, silicon nitride and/or silicon oxynitride. The first interfacial gate dielectric material layer 16L, when present, may be formed by chemical oxidation, thermal oxidation, nitridation or any combination thereof. The first interfacial gate dielectric material layer 16L may have a thickness from 0.5 nm to 1.5 nm.

The first gate dielectric material layer 18L is composed of a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. First gate dielectric material layer 18L can be formed by any deposition technique including, for example, chemical vapor deposition (CVD), plasma enhanced chemical vapor deposition (PECVD), or atomic layer deposition (ALD). The first gate dielectric material layer 18L can have a thickness in a range from 5 nm to 20 nm. Other thicknesses that are lesser than or greater than the aforementioned thickness range can also be employed for the first gate dielectric material layer 18L.

In one embodiment of the present application, the second gate dielectric material stack (16R, 18R) includes a second interfacial gate dielectric material layer 16R and a second gate dielectric material layer 18R. In another embodiment, the second interfacial gate dielectric material layer 16R may be omitted. In such an embodiment, the second gate dielectric material stack consists of the second gate dielectric material layer 18R. When present, the second interfacial gate dielectric material layer 16R includes one of the interfacial gate dielectric materials mentioned above for the first interfacial gate dielectric material layer 16L. In one embodiment, the second interfacial gate dielectric material layer 16R is composed of a same interfacial gate dielectric material as the first interfacial gate dielectric material layer 16L. In yet another embodiment, the second interfacial gate dielectric material layer 16R may be composed of a different interfacial gate dielectric material than the first interfacial gate dielectric material layer 16L. The second interfacial gate dielectric material layer 16R may be formed utilizing one of the techniques mentioned above for forming the first interfacial gate dielectric material layer 16L. When the first and second interfacial gate dielectric material layers 16L, 16R are composed of a different interfacial gate dielectric material, block mask technology can be used in forming the same.

The second gate dielectric material layer 18R includes one of the gate dielectric materials mentioned above for the first gate dielectric material layer 18L. In one embodiment, the second gate dielectric material layer 18R is composed of a same gate dielectric material as the first gate dielectric material layer 18L. In yet another embodiment, the second gate dielectric material layer 18R may be composed of a different gate dielectric material than the first gate dielectric material layer 18L. The second gate dielectric material layer 18R may be formed utilizing one of the techniques mentioned above for forming the first gate dielectric material layer 18L. When the first and second gate dielectric material layers 18L, 18R are composed of a different gate dielectric material, block mask technology can be used in forming the same.

Figure 3:
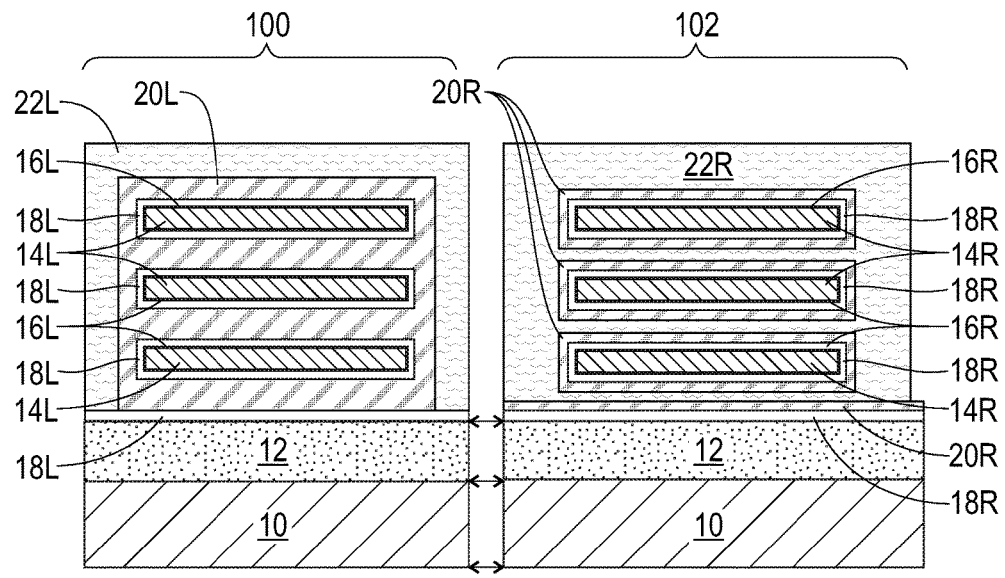
FIG. 3 is a cross sectional view of the exemplary semiconductor structure of FIG. 2 after forming a first material stack of a first titanium nitride layer and a first amorphous silicon layer on the first gate dielectric material stack, and a second material stack of a second titanium nitride layer and a second amorphous silicon layer on the second gate dielectric material stack.

Referring now to FIG. 3, there is illustrated the exemplary semiconductor structure of FIG. 2 after forming a first material stack of a first titanium nitride layer 20L and a first amorphous silicon layer 22L on the first gate dielectric material stack (16L, 18L), and a second material stack of a second titanium nitride layer 20R and a second amorphous silicon layer 22R on the second gate dielectric material stack (16R, 18R).

As is shown, the first titanium nitride layer 20L that is formed has a thickness that is sufficient to fill in the remaining gap located between and beneath each suspended semiconductor channel material nanosheet 14L in the pFET device region 100; the thickness of the first titanium nitride layer 20L is also sufficient enough to fill in the gap located between and beneath the bottommost suspended semiconductor channel material nanosheet 14L. In one embodiment, the thickness of the first titanium nitride layer 20L is from 15 Angstroms to 30 Angstroms. The first titanium nitride layer 20L may be formed utilizing a deposition process such, as for example, ALD, CVD, or PECVD.

The second titanium nitride layer 20R that is formed has a thickness that does not completely fill in the remaining gap between and beneath each suspended semiconductor channel material nanosheet 14R in the nFET device region 102; the thickness of the second titanium nitride layer 20R also does not completely fill in the gap located between and beneath the bottommost suspended semiconductor channel material nanosheet 14R and second gate dielectric material layer 18R that is formed on the topmost surface of the dielectric isolation layer 12 in the nFET device region 102. In one embodiment, the thickness of the second titanium nitride layer 20R is from 5 Angstroms to 15 Angstroms. The second titanium nitride layer 20R may be formed utilizing a deposition process such, as for example, ALD, CVD, or PECVD. As is shown in FIG. 3, a second titanium layer 20R forms on the topmost surface of the second gate dielectric material layer 18R that is formed directly upon the dielectric isolation layer 12 in the nFET device region 102.

It is noted that the order of forming the first and second titanium nitride layers 20L, 20R may vary. For example, the first titanium nitride layer 20L may be formed prior to forming the second titanium nitride layer 20R. Alternatively, the first titanium nitride layer 20L may be formed after forming the second titanium nitride layer 20R. In either embodiment, a block mask is formed over one of the device regions while the other device region is processed to include the desired titanium nitride layer.

Following the formation of the first and second titanium nitride layers 20L, 20R, first and second amorphous silicon layers 22L, 22R are formed. The first and second amorphous silicon layers 22L, 22R are formed simultaneously utilizing a same deposition process such as, for example CVD or PECVD. A planarization process such as, for example, chemical mechanical polishing (CMP), may follow the formation of the first and second amorphous silicon layers 22L, 22R.

On one hand, and due to the thickness of the first titanium nitride layer 20L which completely fills in the gap located between and beneath each of the suspended semiconductor channel material nanosheets 14L in the pFET device region 100, no portion of the first amorphous silicon layer 22L is located beneath the suspended semiconductor channel material nanosheets 14L in the pFET device region 100. On the other hand and due to the thickness of the second titanium nitride layer 20R which does not completely fill in the gap located between and beneath each of the suspended semiconductor channel material nanosheets 14R in the nFET device region 102, a portion of the second amorphous silicon layer 22R is located between and beneath the suspended semiconductor channel material nanosheets 14R in the nFET device region 102.

Figure 4:
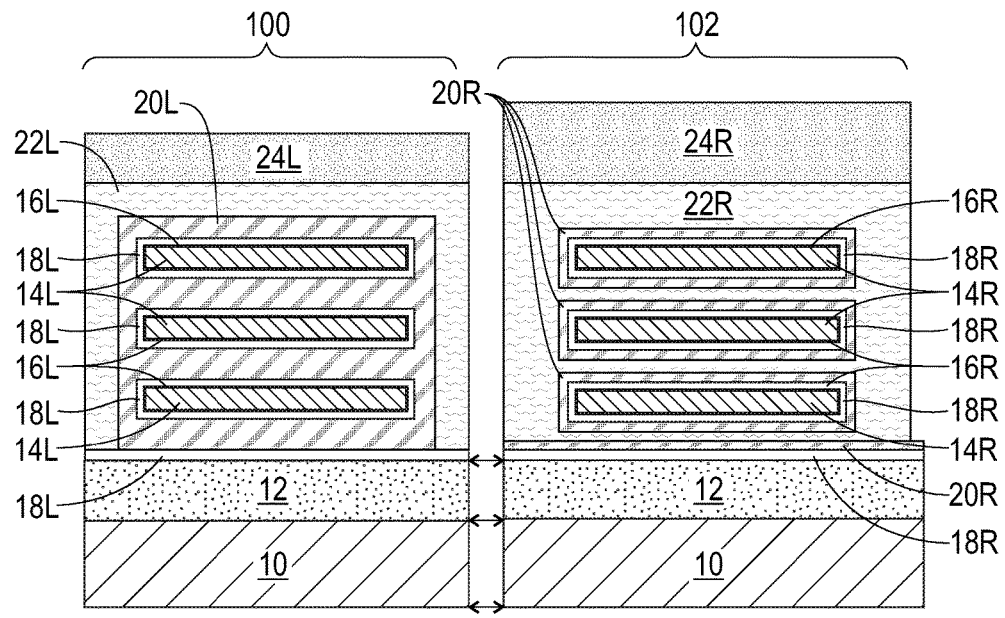
FIG. 4 is a cross sectional view of the exemplary semiconductor structure of FIG. 3 after forming a first nickel layer having a first thickness on the first material stack in the pFET device region, and a second nickel layer having a second thickness that is greater than the first thickness on the second material stack in the nFET device region.

Referring now to FIG. 4, there is illustrated the exemplary semiconductor structure of FIG. 3 after forming, in any order, a first nickel layer 24L having a first thickness on the first material stack (20L, 22L) in the pFET device region 100, and a second nickel layer 24R having a second thickness that is greater than the first thickness on the second material stack (20R, 22R) in the nFET device region 102.

The first nickel layer 24L and second nickel layer 24R can be formed utilizing a deposition process such as such as, for example, plating, sputtering, CVD or PECVD. Block mask technology may or may not be used in forming the first and second nickel layers 24L, 24R. The first thickness of the first nickel layer 24L typically ranges from 15 nm to 60 nm, while the second thickness of the second nickel layer 24R typically ranges from 70 nm to 120 nm.

Figure 5:
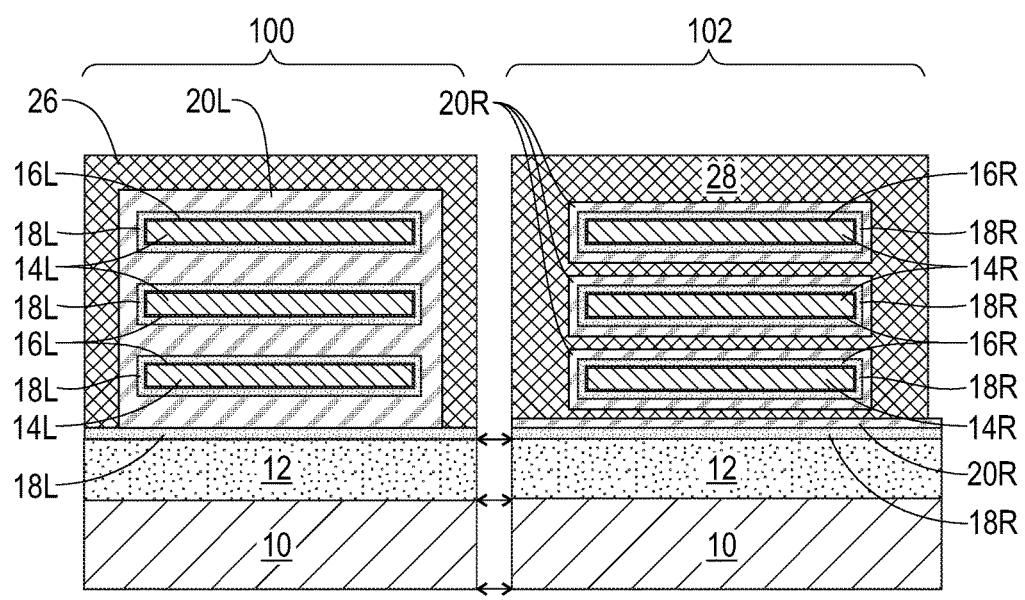
FIG. 5 is a cross sectional view of the exemplary semiconductor structure of FIG. 4 after performing an anneal to convert the first nickel layer and the first amorphous silicon layer in the pFET device region into a nickel monosilicide (i.e., NiSi) gate electrode layer, and to convert the second nickel layer and the second amorphous silicon layer in the nFET device region into a $Ni_3Si$ gate electrode layer.

Referring now to FIG. 5, there is illustrated the exemplary semiconductor structure of FIG. 4 after performing an anneal to convert the first nickel layer 24L and the first amorphous silicon layer 22L in the pFET device region 100 into a nickel monosilicide (i.e., NiSi) gate electrode layer 26, and to convert the second nickel layer 24R and the second amorphous silicon layer 22R in the nFET device region 102 into a $Ni_3Si$ gate electrode layer 28. As is shown, no portion of the NiSi gate electrode layer 26 is formed between and beneath the suspended semiconductor channel material nanosheets 14L in the pFET device region 100, while a portion of the $Ni_3Si$ gate electrode layer 28 is present between and beneath each suspended semiconductor channel material nanosheet 14R in the nFET device region 102. The NiSi gate electrode layer 26 does not introduce any strain into the suspended semiconductor channel material nanosheets, while the Ni₃Si gate electrode layer 28 introduces tensile strain into the suspended semiconductor channel material nanosheets 14R in the nFET device region 102. During the anneal, a slight volume expansion is observed in the pFET device region 100, while an even higher volume expansion is observed in the nFET device region 102. Thus, the nFET gate-all-around nanosheet structure that is formed in the nFET device region 102 exhibits a boost in performance, while no significant change in the performance of the pFET gate-all-around structure shown in the pFET device region 100 is observed.

After annealing, any unreactive first nickel layer metal layer 24L and/or any unreactive second nickel layer 24R may be removed utilizing an etching process that is selective for removing nickel. The anneal may be performed at a temperature from 400° C. to 600° C. The anneal may include a furnace anneal, a rapid thermal anneal or a laser anneal. In some embodiments, a rapid thermal anneal performed at about 450° C. for 30 seconds to 90 seconds is employed.

Notably, FIG. 5 illustrates a semiconductor structure in accordance with the present application that includes a pFET gate-all-around nanosheet structure (on left hand side of the drawing) and a laterally adjacent nFET gate-all-around nanosheet structure (on the right hand side of the drawing). The pFET gate-all-around nanosheet structure includes a first vertical stack of suspended semiconductor channel material nanosheets 14L, a first gate dielectric material layer 18L wrapped around each suspended semiconductor channel material nanosheet 14L of the first vertical stack, a first titanium nitride layer 20L laterally surrounding each suspended semiconductor channel material nanosheet 14L of the first vertical stack, wherein a portion of the first titanium nitride layer 20L is located completely between and beneath each semiconductor channel material nanosheets 14L of the first vertical stack, and a nickel monosilicide gate electrode layer 26 located on the first titanium nitride layer 20L.

The nFET gate-all-around nanosheet structure includes a second vertical stack of suspended semiconductor channel material nanosheets 14R, a second gate dielectric material layer 18R wrapped around each suspended semiconductor channel material nanosheet 14R of the second vertical stack, a second titanium nitride layer 20R laterally surrounding each suspended semiconductor channel material nanosheet 14R of the second vertical stack, wherein a portion of the second titanium nitride layer 20R is located partially between and beneath each suspended semiconductor channel material nanosheet 14R of the second vertical stack, and a Ni₃Si gate electrode layer 28 located on the second titanium nitride layer 20R, wherein a portion of the Ni₃Si gate electrode layer 28 is located between and beneath each suspended semiconductor channel material nanosheet 14R of the second vertical stack.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a pFET gate-all-around nanosheet structure comprising a first vertical stack of suspended semiconductor channel material nanosheets, a first gate dielectric material layer wrapped around each suspended semiconductor channel material nanosheet, a first titanium nitride layer laterally surrounding each suspended semiconductor channel material nanosheet of the first vertical stack, wherein a portion of the first titanium nitride layer is located completely between and beneath each suspended semiconductor channel material nanosheet of the first vertical stack, and a nickel monosilicide gate electrode layer located on the first titanium nitride layer; and
   an nFET gate-all-around nanosheet structure comprising a second vertical stack of suspended semiconductor channel material nanosheets, a second gate dielectric material layer wrapped around each suspended semiconductor channel material nanosheet of the second vertical stack, a second titanium nitride layer laterally surrounding each suspended semiconductor channel material nanosheet of the second vertical stack, wherein a portion of the second titanium nitride layer is located partially between and beneath each suspended semiconductor channel material nanosheet of the second vertical stack, and a Ni₃Si gate electrode layer located on the second titanium nitride layer, wherein a portion of the Ni₃Si gate electrode layer is located between and beneath each suspended semiconductor channel material nanosheet of the second vertical stack.

2. The semiconductor structure of claim 1, wherein the nickel monosilicide gate electrode layer does not introduce a strain into each suspended semiconductor channel material nanosheet of the first vertical stack of suspended semiconductor channel material nanosheets.

3. The semiconductor structure of claim 2, wherein the Ni₃Si layer introduces a tensile strain into each suspended semiconductor channel material nanosheet of the second vertical stack of suspended semiconductor channel material nanosheets.

4. The semiconductor structure of claim 3, wherein each suspended semiconductor channel material nanosheet of the first and second vertical stacks of suspended semiconductor channel material nanosheets comprises silicon.

5. The semiconductor structure of claim 4, wherein the silicon has a (100) crystal orientation.

6. The semiconductor structure of claim 1, wherein the pFET gate-all-around nanosheet structure and the nFET gate-all-around nanosheet structure are located above a dielectric isolation layer that is present on a topmost surface of a semiconductor substrate.

7. The semiconductor structure of claim 1, further comprising a first interfacial dielectric material layer located between the first gate dielectric material layer and each suspended semiconductor channel material nanosheet of the first vertical stack.

8. The semiconductor structure of claim 1, further comprising a second interfacial dielectric material layer located between the second gate dielectric material layer and each suspended semiconductor channel material nanosheet of the second vertical stack.

9. The semiconductor structure of claim 6, wherein a first gate dielectric material is present on a topmost surface of the dielectric isolation layer and beneath the pFET gate-all-around nanosheet structure.

10. The semiconductor structure of claim 9, wherein a second gate dielectric material and a titanium nitride layer having the second thickness are present on a topmost surface of the dielectric isolation layer and beneath the nFET gate-all-around nanosheet structure.

11. A semiconductor structure comprising:
an nFET gate-all-around nanosheet structure located above a semiconductor substrate and comprising a vertical stack of suspended semiconductor channel material nanosheets, a gate dielectric material layer wrapped around each suspended semiconductor channel material nanosheet of the vertical stack, a titanium nitride layer laterally surrounding each suspended semiconductor channel material nanosheet of the vertical stack, wherein a portion of the second titanium nitride layer is located partially between and beneath each suspended semiconductor channel material nanosheet of the vertical stack, and a $Ni_3Si$ gate electrode layer located on the titanium nitride layer, wherein a portion of the $Ni_3Si$ gate electrode layer is located between and beneath each suspended semiconductor channel material nanosheet of the second vertical stack.

12. A method of forming a semiconductor structure, the method comprising:
providing a plurality of suspended semiconductor channel material nanosheets located in a pFET device region, and a plurality of suspended semiconductor channel material nanosheets located in an nFET device region;
forming, in any order, a first gate dielectric material around each suspended semiconductor channel material nanosheet in the pFET device region and a second gate dielectric material layer around each suspended semiconductor channel material nanosheet in the nFET device region;
forming, in any order, a first titanium nitride layer laterally surrounding each suspended semiconductor channel material nanosheet in the pFET device region, wherein a portion of the first titanium nitride layer is located completely between and beneath each suspended semiconductor channel material nanosheet in the pFET device region, and a second titanium nitride layer laterally surrounding each suspended semiconductor channel material nanosheet in the nFET device region, wherein a portion of the second titanium nitride layer is located partially between and beneath each suspended semiconductor channel material nanosheet in the nFET device region;
forming a first amorphous silicon layer on the first titanium layer, and a second amorphous silicon layer on the second titanium, wherein the second amorphous layer is located between and beneath each suspended semiconductor channel material nanosheet in the nFET device region;
forming, in any order, a first nickel layer having a first thickness on the first amorphous silicon layer, and a second nickel layer having a second thickness that is greater than the first thickness on the second amorphous silicon layer; and
performing an anneal to convert the first nickel layer and the first amorphous silicon layer in the pFET device region into nickel monosilicide gate electrode layer, and to convert the second nickel layer and the second amorphous silicon layer in the nFET device region into a $Ni_3Si$ gate electrode layer.

13. The method of claim 12, wherein prior to forming the first gate dielectric material layer, a first interfacial gate dielectric material layer is formed around each suspended semiconductor channel material nanosheet in the pFET device region, prior to forming the second gate dielectric material layer, a second interfacial gate dielectric material layer is formed around each suspended semiconductor channel material nanosheet in the nFET device region.

14. The method of claim 12, wherein the plurality of suspended semiconductor channel material nanosheets located in the pFET device region, and the plurality of suspended semiconductor channel material nanosheets located in the nFET device region are located above a dielectric isolation layer that is formed on a topmost surface of a semiconductor substrate.

15. The method of claim 12, wherein the nickel monosilicide gate electrode layer does not introduce a strain into each suspended semiconductor channel material nanosheet in the pFET device region.

16. The method of claim 15, wherein the $Ni_3Si$ layer introduces a tensile strain into each suspended semiconductor channel material nanosheet in the nFET device region.

17. The method of claim 14, wherein the forming of the first gate dielectric material layer also forms a first gate dielectric material on a topmost surface of the dielectric isolation layer in the pFET device region.

18. The method of claim 14, wherein the forming of the second gate dielectric material also forms a second gate dielectric material on a topmost surface of the dielectric isolation layer in the nFET device region.

19. The method of claim 18, wherein the forming the second titanium nitride layer also forms a titanium nitride layer having the second thickness of the topmost surface of the second gate dielectric material that is formed on the topmost surface of the dielectric isolation layer in the nFET device region.

20. The method of claim 12, wherein the annealing is a rapid thermal anneal that is performed at about 450° C. for a time period of from 30 seconds to 90 seconds.

* * * * *